United States Patent [19]

D'Arrigo et al.

[11] Patent Number: 4,716,322
[45] Date of Patent: Dec. 29, 1987

[54] POWER-UP CONTROL CIRCUIT INCLUDING A COMPARATOR, SCHMITT TRIGGER, AND LATCH

[75] Inventors: Sebastiano D'Arrigo, Houston, Tex.; Giuliano Imondi, Rieti; Sossio Vergara, Frattamaggiore, both of Italy

[73] Assignee: Texas Instruments Incorporated, Dallas, Tex.

[21] Appl. No.: 843,532

[22] Filed: Mar. 25, 1986

[51] Int. Cl.⁴ ............... H03K 17/22; H03K 17/30
[52] U.S. Cl. ............................ 307/592; 307/246;
    307/362; 307/494; 307/594; 307/595; 307/597;
    307/605; 307/272.1
[58] Field of Search .................. 307/200 B, 443, 451,
    307/494, 354, 362, 246, 584, 585, 265, 272 R,
    592, 593–595, 597, 601, 603, 605, 608; 340/636,
    660

[56] References Cited

U.S. PATENT DOCUMENTS

| | | | |
|---|---|---|---|
| 3,950,654 | 4/1976 | Broedner et al. | 307/593 |
| 4,260,907 | 4/1981 | Winebarger | 307/592 X |
| 4,296,338 | 10/1981 | Thomas | 307/594 X |
| 4,385,245 | 5/1983 | Ulmer | 307/594 |
| 4,419,596 | 12/1983 | Kikuchi | 307/603 |
| 4,553,054 | 11/1985 | Kase et al. | 307/601 X |
| 4,581,552 | 4/1986 | Womack et al. | 307/200 B X |
| 4,611,126 | 9/1986 | Miller | 307/597 X |

Primary Examiner—Stanley D. Miller
Assistant Examiner—D. R. Hudspeth
Attorney, Agent, or Firm—John G. Graham; Rodney M. Anderson

[57] ABSTRACT

A device for controlling the states of various parts of a main circuit during "power-on" operations which includes an auxiliary circuit for generating a disabling signal when the value of the main circuit supply voltage is below a threshold value for use in disabling the parts of the main circuit.

5 Claims, 2 Drawing Figures

POWER-UP CONTROL CIRCUIT INCLUDING A COMPARATOR, SCHMITT TRIGGER, AND LATCH

BACKGROUND OF THE INVENTION

The present invention relates to a device for controlling the states of various parts of a circuit during "power-on" operations in order to avoid unwanted operations.

A common problem with integrated circuit occurs during "power-on" when the power supplies are rising to their normal output values. In such cases unpredictable and unwanted operations can sometimes occur such as, for example, spurious write cycles in an electrically erasable programmable read only memory cell. A common approach has been to use external circuitry which enables the device only when the supply voltage is higher than a value at which the device is fully operational.

Accordingly, it is an object of the invention to provide an improved device for keeping an integrated circuit from performing unwanted operations during "power-on".

SUMMARY OF THE INVENTION

According to the invention there is provided a device for controlling the states of various parts of a main circuit during "power-on" operations which includes an auxiliary circuit for generation a disabling signal when the value of the main circuit supply voltage is below a threshold value for use in disabling the parts of the main circuit.

The auxiliary circuit may utilize a reference voltage generator coupled to the supply voltage which is capable of generating a reference voltage from values of the supply voltage below the threshold value and circuit means for comprising the main circuit supply voltage, $V_{dd}$, to the reference voltage, $V_R$, and when $V_R > V_{dd}$, generating a disabling signal and when $V_{dd}$ rises above $V_R$, initiating the removal of the disabling signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
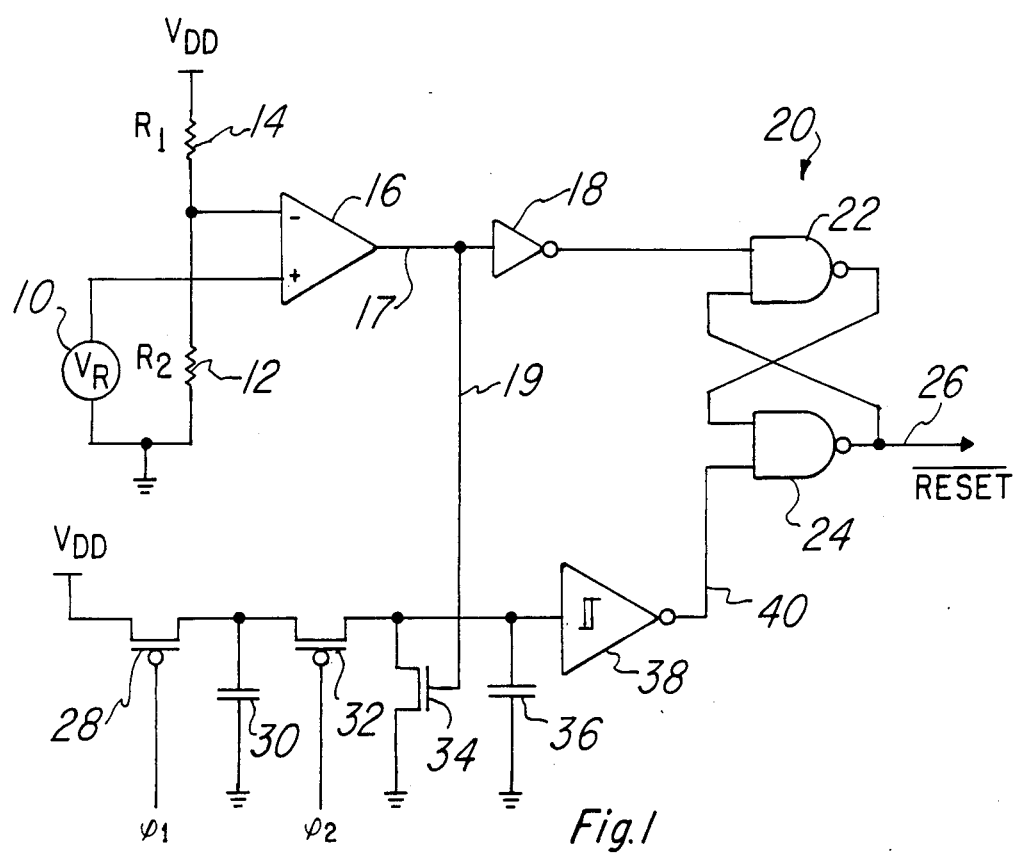
FIG. 1 is a circuit diagram of the circuit for generating a disabling signal for use in disabling various parts of a main circuit.

With reference to FIG. 1 there is shown an auxiliary circuit for generating a signal RESET which is the complement of a signal $\overline{RESET}$ used to disable various parts of a main circuit (not shown). The circuit uses a reference voltage source 10 capable of generating a reference voltage $V_R$ at voltage values well below the normal supply voltage $V_{DD}$ and a comparator 16 also capable of operating at such low voltages. Typically, the reference voltage would be slightly greater than 1 volt and would operate at $V_{DD}$ less than 2 volts. The output of the reference voltage is fed into the non-inverting input of the comparator while a fraction of the supply voltage $V_{DD}$ determined by resistor chain $R_1$ and $R_2$ coupled between $V_{DD}$ and ground is fed into the inverting input of comparator 16.

The output of the comparator 16 on line 17 is directed into inverter 18 as well as to the gate of N-channel transistor 34. The output of inverter 18 goes to one of two inputs of NAND gate 22 which together with NAND gate 24 form a flip flop 20. Another leg of the auxiliary circuit consists of a capacitor 30 coupled between ground and one end of the source to drain path of a P-channel transistor 28 gated by negative going phases of clock signal $\phi_1$. The other end of the source to drain path of transistor 28 is connected to $V_{DD}$. A second capacitor 36 is also coupled at one end to ground and at its other end to one end of the source to drain path of P-channel transistor 32. The other end of the source to drain path of transistor 32 is connected to capacitor 30. Transistor 32 is gated on by negative going phases of clock signal $\phi_2$. The common junction of capacitor 36 and transistor 32 is also connected to the input of inverting Schmitt trigger 38. Transistor 34 is connected between the input of inverting Schmitt trigger 38 and ground.

The output of the Schmitt trigger 38 connects to one of two inputs of NAND gate 24. The output of NAND gate 24 on line 26 is the complement of the disabling signal RESET.

Figure 2:
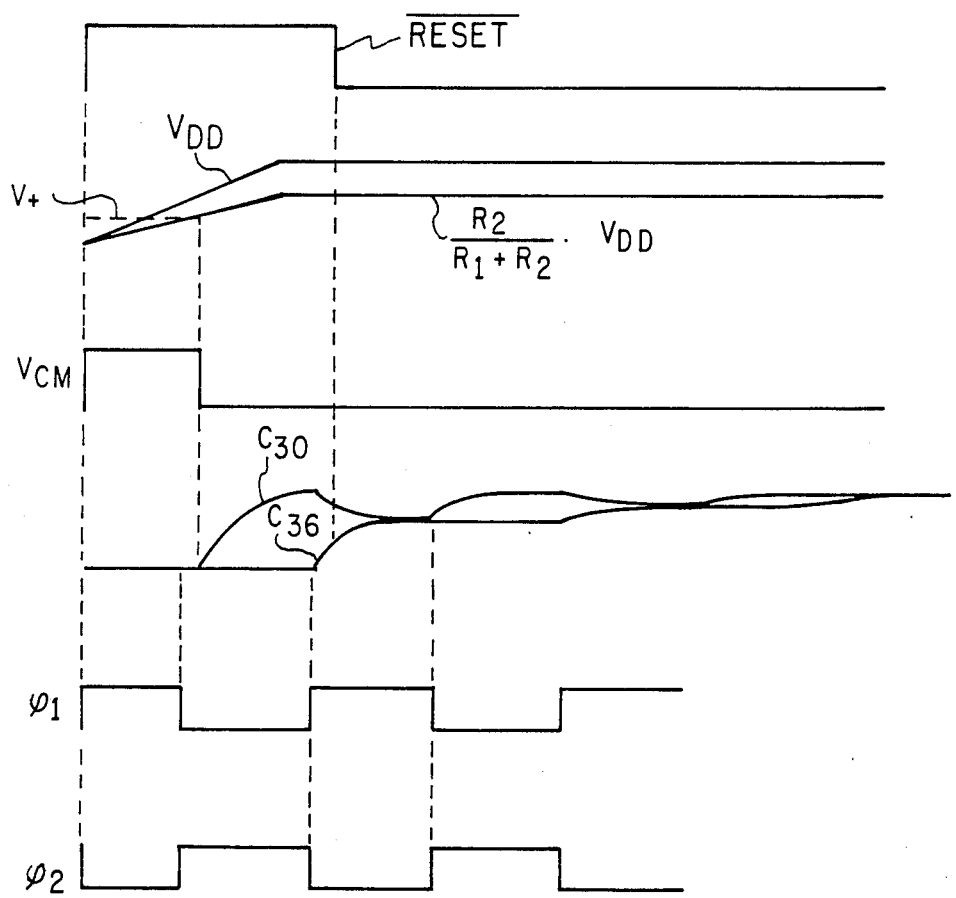
FIG. 2 is a diagram of a series of waveforms for voltages at various parts of the circuit shown in FIG. 1.

In considering the operation of the auxiliary circuit, for simplicity it can be assumed that during "power-on" the main supply voltage $V_{DD}$ rises approximately linearly as seen in the second waveform diagram of FIG. 2. Thus, the value of the voltage at the inverting input of comparator 16 will be $V_{DD} \times R_2/(R_1+R_2)$. While the latter value is less that $V_R$ then the output of comparator 16 on line 17 will be high and transistor 34 will be on grounding the input to Schmitt trigger 38. As a consequence the output of the Schmitt trigger 38 on line 40 will be high. The signal on line 17 after passing through inverter 18 at this time is low. Thus, the output of NAND gate 22 will be high and the output of NAND gate 24, namely $\overline{RESET}$, will be low. With the complement voltage RESET ghigh the main circuit will be disabled. The delay introduced by capacitors 30 and 36 permits the $V_{DD}$ voltage at all points of the main circuit to rise before being enabled.

Once the value of the voltage at the inverting input of comparator 16 exceeds the reference voltage $V_R$, the output of comparator 16 on line 17 goes low cutting off transistor 34. On the previous negative going phase of $\phi_1$ capacitor 30 has been charged through transistor 28 towards the value of $V_{DD}$ which was ramping up. On the negative going phase of clock cycle $\phi_2$ which turns on transistor 32, capacitor 36 undergoes charge sharing with capacitor 30 and charges up towards a voltage determined by the previous charge on capacitor 30 and the values of capacitance of capacitors 30 and 36. Once the voltage across capacitor 36 has increased to a threshold value of the inverting Schmitt trigger 38 the latter flips changing its output on line 40 from high to low. When the latter happens the flip flop circuit 20 flips and causes the signal $\overline{RESET}$ on line 26 to go high. The high value of $\overline{RESET}$ on line 26 can then be inverted and used as an enabling signal to the various parts of a main circuit. It will be appreciated that such a signal is equivalent to removal of a disabling signal.

After operation when $V_{DD}$ goes low, as soon as it falls to a value at which the voltage on the inverting input of comparator 16 is less than $V_R$ the output on line 17 goes high and turns on transistor 34 grounding the input to Schmitt trigger 38. The output of the latter on line 40 goes high enabling NAND gate 24. When the output of inverter 18 which is low is applied to NAND gate 22 the flip flop 20 flips and issues a low $\overline{\text{RESET}}$ signal on line 26. The complement signal RESET again results in disabling parts of the main circuit.

The time duration it takes for the signal $\overline{\text{RESET}}$ on line 26 to go high and allow the main circuit to operate depends on the value $V_R \times (R_2/(R_1+R_2))$, the capacitances of capacitors 30 and 36, the clock signals $\phi_1$ and $\phi_2$, the threshold of the Schmitt trigger 38 and the delay in travelling across the chip to the various parts of the main circuit to be enabled.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A circuit for generating an enable signal responsive to the voltage of a power supply during power-up, comprising:

a reference voltage generator, connected to said power supply, for generating a reference voltage;

a comparator, coupled to said reference voltage generator and to said power supply, for for generating a voltage at its output corresponding to the difference between said power supply voltage and the reference voltage;

capacitor means coupled to said power supply and to said output of said comparator such that in response to the voltage of said output of said comparator indicating that said power supply voltage exceeds a predetermined value, said capacitor means is enabled to charge up from said power supply;

a trigger circuit having an input coupled to said capacitor means and responsive to the voltage on the latter to reversibly change its output voltage;

a latch having a set input coupled to said output of said comparator, and having a reset input coupled to the output of said trigger circuit so that, responsive to said power supply voltage exceeding said predetermined value during power-up, the output of said latch generates an enable signal, and so that, responsive to said power supply voltage thereafter falling below said predetermined value, the output of said latch generates a disable signal.

2. A circuit according to claim 3, wherein said capacitor means comprises:

a first pass gate coupled to said power supply and controlled by a first clock signal;

a first capacitor coupled between ground and said first pass gate such that on conduction of said first pass gate said first capacitor is charged by said power supply;

a second pass gate coupled to said first capacitor and controlled by a second clock signal;

a second capacitor having one terminal coupled to ground and a second terminal coupled to a trigger junction of said second pass gate and an input of said trigger circuit;

and means for grounding the trigger junction in response to the voltage at said output of said comparator.

3. A circuit according to claim 2, wherein said trigger circuit is a Schmitt trigger.

4. A circuit according to claim 3, wherein said comparator has said power supply coupled to an inverting input thereof, and has said reference voltage generator coupled to a non-inverting input thereof;

and wherein said grounding means is a transistor having a source to drain path coupled between the trigger junction and ground, and operative in response to the voltage at the output of said comparator exceeding the threshold voltage of said transistor to turn on and ground the trigger input.

5. A circuit according to claim 4, wherein said comparator further comprises a voltage divider connected to said power supply and to said inverting input, so that the voltage at the output of said comparator is zero responsive to a predetermined fraction of the power supply voltage being equal to said reference voltage.

* * * * *